United States Patent
Tao et al.

[11] Patent Number: 5,389,904
[45] Date of Patent: Feb. 14, 1995

[54] SURFACE-MOUNTABLE, FREQUENCY SELECTIVE MICROWAVE IC PACKAGE

[75] Inventors: Kuang-Chung Tao, Hsinchu; Chao-Hui Lin, Taiching, both of

[73] Assignee: Industrial Technology Research Institute, Taiwan, R.O.C., Hsinchu,

[21] Appl. No.: 944,105

[22] Filed: Sep. 11, 1992

[51] Int. Cl.⁶ .......................... H01P 3/08; H01P 1/00
[52] U.S. Cl. ..................... 333/246; 333/204; 333/247
[58] Field of Search ............. 333/32, 238, 204, 205, 333/246, 247; 257/275–277, 690–693; 174/50.52, 52.1, 52.4, 52.5

[56] References Cited

U.S. PATENT DOCUMENTS

| | | | |
|---|---|---|---|
| 3,483,308 | 12/1969 | Wakely | 174/52.5 |
| 4,353,047 | 10/1982 | Noguchi et al. | 333/35 X |
| 4,626,805 | 12/1986 | Jones | 333/246 X |
| 4,713,634 | 12/1987 | Yamamura | 333/247 X |
| 4,768,004 | 8/1988 | Wilson | 333/247 X |
| 4,899,118 | 2/1990 | Polinski, Sr. | 333/247 X |
| 4,901,041 | 2/1990 | Pengelly | 333/246 X |
| 4,951,014 | 8/1990 | Wohlert et al. | 333/247 X |
| 5,014,115 | 5/1991 | Moser | 333/247 X |
| 5,065,123 | 11/1991 | Heckaman et al. | 333/246 |

FOREIGN PATENT DOCUMENTS 02189801  9/1987  Japan ..................... 333/246

Primary Examiner—Seungsook Ham
Attorney, Agent, or Firm—H. C. Lin

[57] ABSTRACT

This invention discloses a monolithic microwave integrated circuit (MMIC) package with filtering property. The filtering action is inherent with the structure of the package. This structure overcomes the limitation of traditional packages, which can only transmit the signal without processing the signal. A specially designed surface-mountable structure is used in the input and the output terminals. Any impedance from this special structure can be compensated by the filtering structure in each port. The filtering structure is located between the input (or the output) structure and the die cavity in each port. The package also provides ground connection to the MMIC by means of metal-filled via holes connected to the surface mounting side.

7 Claims, 6 Drawing Sheets

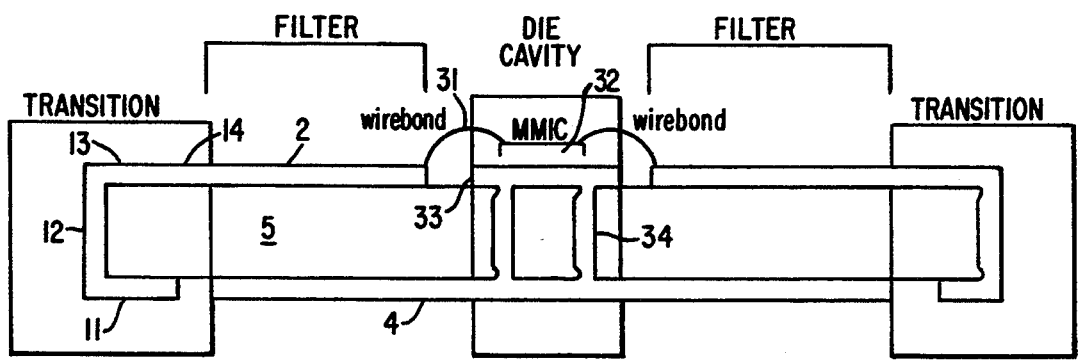
*Fig. 4a*
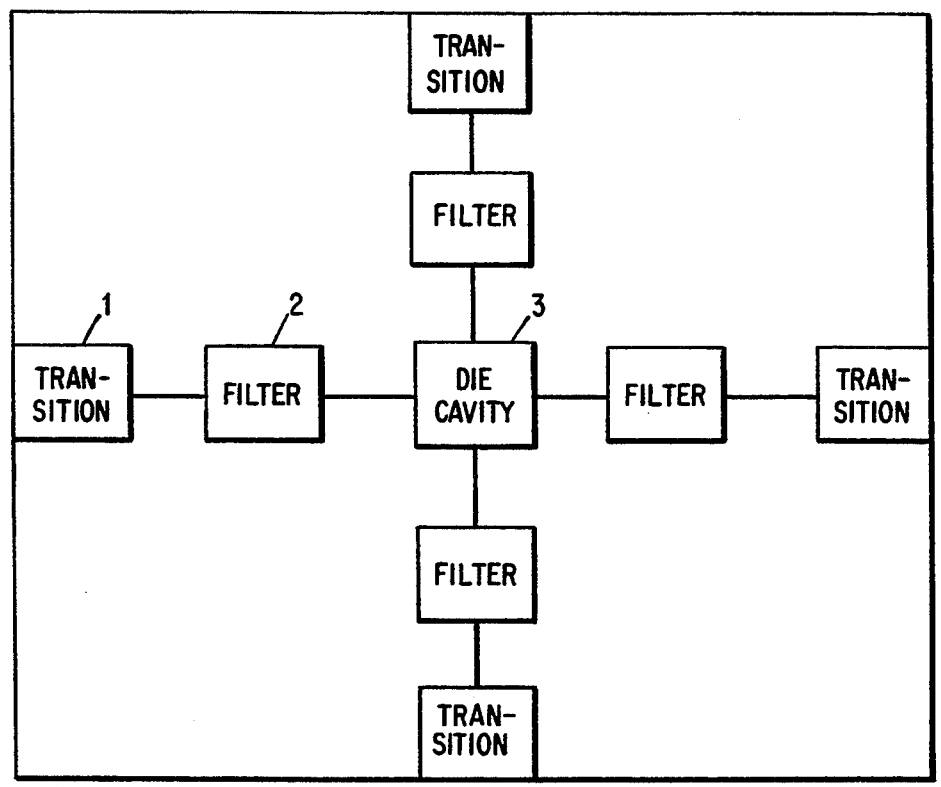
FILTER = BANDSTOP, BANDPASS, LOWPASS, HIGHPASS
*Fig. 4b*
*Fig. 4c*
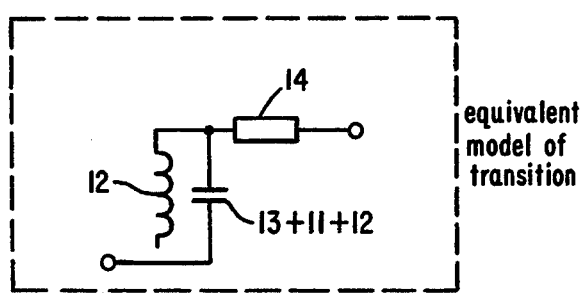
equivalent model of transition

SURFACE-MOUNTABLE, FREQUENCY SELECTIVE MICROWAVE IC PACKAGE

BACKGROUND OF THE INVENTION

This invention is related to microwave integrated circuit (MMIC) packages, capable of surface mounting.

According to prior art, microwave IC packages can be classified into the following types:

1. Can-type Package

This type of structure is shown in FIG. 1. The bottom surface provides input and output pins and ground connection. A can covers the bottom seat. Signals are transmitted through these pins, which are wire bonded at the top to the input and output terminals of an integrated circuit (IC). Such a structure does not have surface mounting capability, and cannot operate at very high frequency. However, the cost of this kind of package is low, and is therefore quite popular.

2. Ceramic-brazing-type Package

This kind of structure is shown in FIG. 2 and disclosed in U.S. Pat. No. 4,901,041. A ceramic substrate is treated with thin-film process, and then precision-brazing at high temperature to yield the final structure. This structure has the advantage that it can be surface-mounted and has good high frequency performance up to 20 GHz due to small impedance mismatch of the interconnections. However, the package requires much more complex process such as high temperature brazing, and the cost is high.

3. Mechanical Type Package

This structure is shown in FIG. 3 and disclosed in U.S. Pat. No. 4,951,014. A machined holder provides all the input and output terminals and the ground plane. A circuit boards are placed inside the holder and interconnected with bond-wires. The integrated circuits are placed at the bottom of the holder or on the circuit boards, and connected to the input and output terminals. This type of package is primitive costly and cannot be surface mounted. The frequency response is not high due to mismatch error of the bond-wires.

Although the foregoing structures have different features, they all have a common characteristic, namely: the packages have only signal transmission capacity but not signal processing capability.

SUMMARY OF THE INVENTION

The object of this invention is to provide a package which has both signal transmission function and signal processing function (e.g. filter function). Another object of this invention is to provide a package which can be surface mounted. A further object of this invention is to provide a package which is inexpensive and easy to fabricate.

These objects are achieved with a multiple function package. It includes: specially designed input and output terminals coplanar with the power supply terminals on the back side of a dielectric plate; a cavity for mounting the IC, and a filtering structure between the I/O terminals and the die cavity. To be surface-mountable and yet to avoid a complicated and expensive high temperature precision brazing process, a compensated circuit is provided and is included in the filtering structure. The compensation method is to transform the input and output port into equivalent series LC circuit. This equivalent circuit is incorporated into the filter design.

BRIEF DESCRIPTION OF THE DRAWINGS

FIG. 4(a) shows the structure of the microwave package of this invention. FIG. 4(b) shows the block diagram of this structure. FIG. 4(c) shows the equivalent circuit of the I/O terminals of this package.

DETAILED DESCRIPTION OF THE PREFERRED EMBODIMENT

Figure 3:
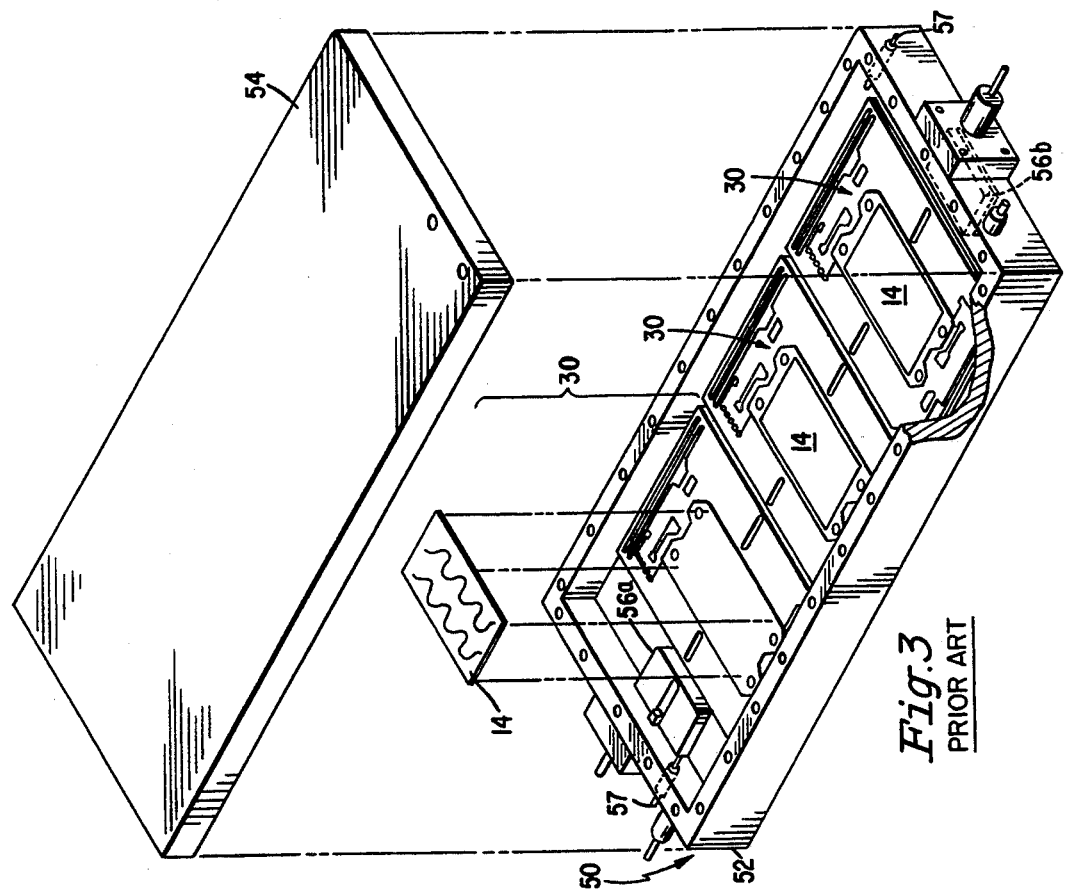
FIG. 3 shows the prior art of still another microwave package with mechanical type package.
Figure 1B:
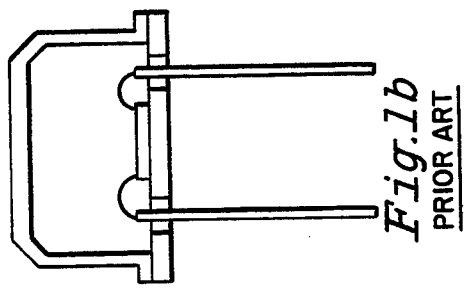
FIGS. 1(a) and 1(b) show a prior art of a microwave package with a can-type structure.
Figure 1A:
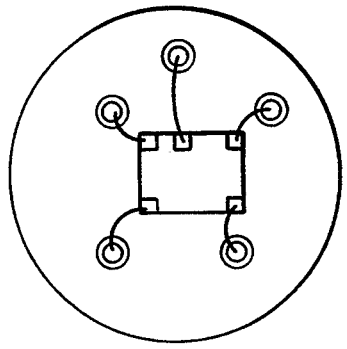
Figure 2:
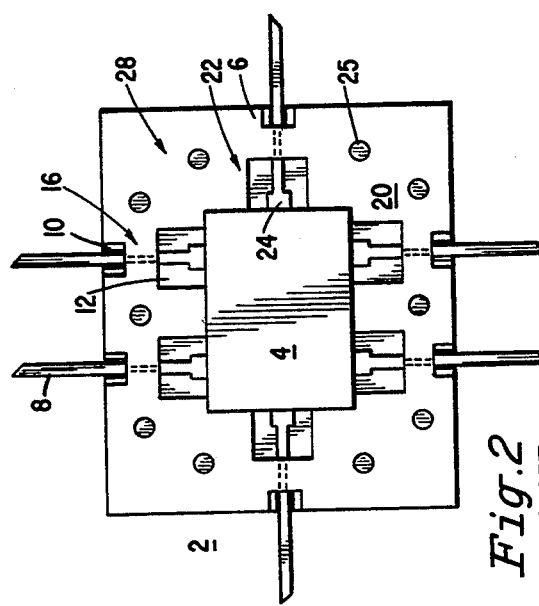
FIG. 2 shows the prior art of another microwave package with ceramic-brazing-type structure.

FIG. 4(a) shows the cross-section view of the package according to the present invention, and FIG. 4(b) shows the block diagram of the functions of the structure. The features of this structure are as follows:

1. This structure features a transition section, which includes: a suspended transmission line 14 and a metal pad 13 placed at the front surface of a dielectric plate 5, another metal pad 11 placed in the back side of the dielectric plate for surface mounting, and a side wall metal 12 wrapped around the edge of the dielectric plate connecting pad 11 to pad 13. The widths of these transition sections are designed to satisfy the requirements of the frequency response. There are as many transition sections as there are input and output terminals as indicated by the block diagram FIG. 4(b) of the front surface, where four sections are shown as an example.

2. Between each input or output port and the IC are connected different kinds of filters 2, such as band-pass, band-stop, low-pass, high-pass. The structures can be microstrip lines, suspended lines or coplanar wave guides. In the design of any particular filtering charactersitic, the equivalent circuit of the transition section should be included.

As shown in FIG. 4(a), input signal is fed from input terminal 11 to filter 2. The signal flows past the side wall 12, the front side metal pad 13, and the suspended transmission line 14 serving as a filter. After filtering by structure 2, the signal is fed through bond-wire 31 to the integrated circuit 32, which lies in a grounded die mounting area. The IC is placed at the center over the ground connection 33 and fixed by silver paste. The ground potential at this point is provided through metal-filled via holes 34 from the back side 4 of the package. Thus, siganls from different transition sections are fed through different individual filters to the central MMIC. The processed signal is then transmitted through other filters to the output terminals. When terminal 11 is an output terminal, the signal flows in the opposite direction. The number of transition sections and the number of filters depends on the requirements of the design. As an example in FIG. 4(b), there are four transition ports and four filters.

The physical structure can be subdivided into four portions: backside metal 11, front side metal 13, sidewall metal 12, and the suspended transmission line 14.

The metal back side is used to be soldered to an external circuit board. This metal section 11 is coplanar with the ground plane 4, so that section 11 and the ground connection 4 can be bonded simultaneously to a circuit board. Section 12 is used to transmit the input signal from the back side up to the front side. Section 14 is used to transmit the signal arriving to the front surface from section 13 to the filter 2. The output of the filter is connected to the IC, located at the center of the package. The adoption of a suspended line section 14 is for the purpose of separating the soldering surfaces, 11 and the ground connection 4, to prevent short circuit. The lumped model of the equivalent circuit of the transition section is shown in FIG. 4(c). The spacing between the front surface and the back surface is represented by a capacitor, and the side-wall is represented by an inductor. The transmission line portion can be simulated by any model commonly used in conventional computer-aided circuit analysis programs. For quantitative analysis, the equivalent inductance is related to the thickness of the dielectric layer and the width of the side-wall metal. The thicker the dielectric layer and the narrower the side-wall metal, the larger is the inductance. The equivalent capacitance is related to the areas of the front, back and side-wall surfaces, and the dielectric plate thickness and the dielectric constant. The thinner the dielectric plate, the larger of the three metal surfaces and the larger the dielectric constant, the larger is the equivalent capacitance. In general, the equivalent inductance and the equivalent capacitance are very small. The values can be calculated from general formulas and from commercial computer-aided design softwares.

The filter structure is located between the transition section and the IC. The basic unit can be a microstrip line, a suspended line or a coplanar wave guide, which are well-known in the art. In the practical implementation of this invention, microstrip lines are adopted. The reason is that it is less susceptible to external inference and easier to lay out the design. If suspended line is used, the back side ground surface 4 should be shrunk to be of the same size as the front side ground connection 33. If coplanar wave guide structure is used, the ground potential for the wave guide can be fed through metal via holes to the front similar to the via hole 4, and the filter can be designed with conventional filter design technique. During design, the equvalent circuit of the transition section should be taken into account.

Figure 5A:
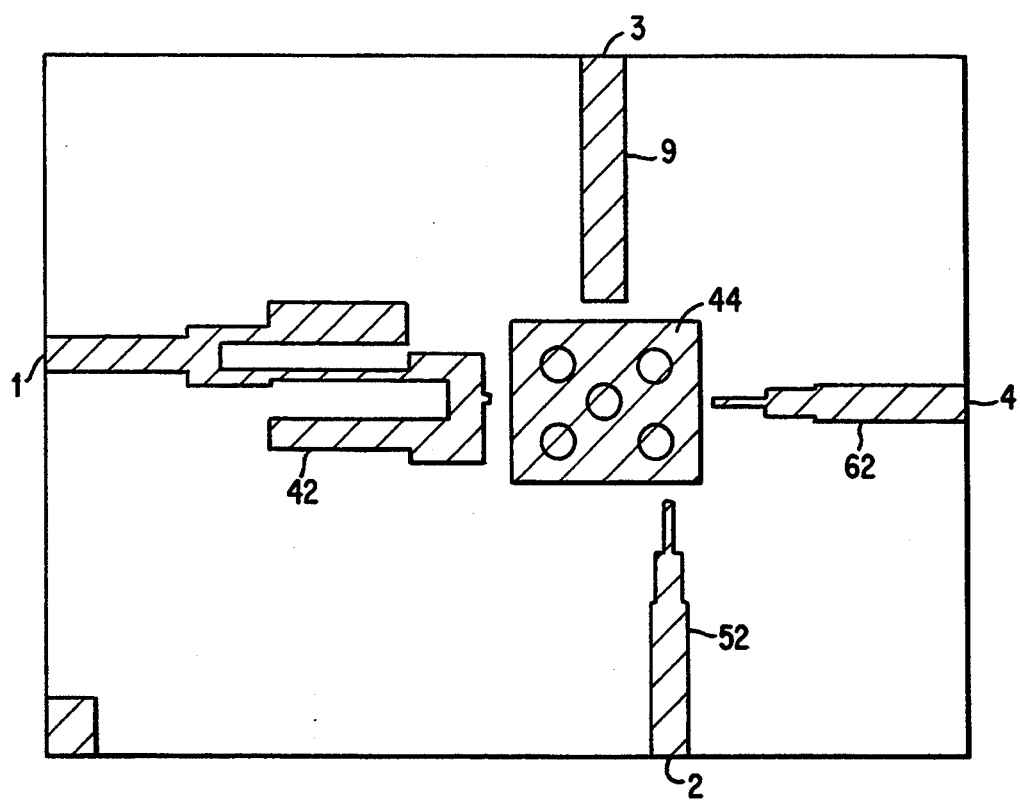
FIG. 5(a) and 5(b) show the front and back views of an actual microwave package designed according to the present invention.
Figure 5B:
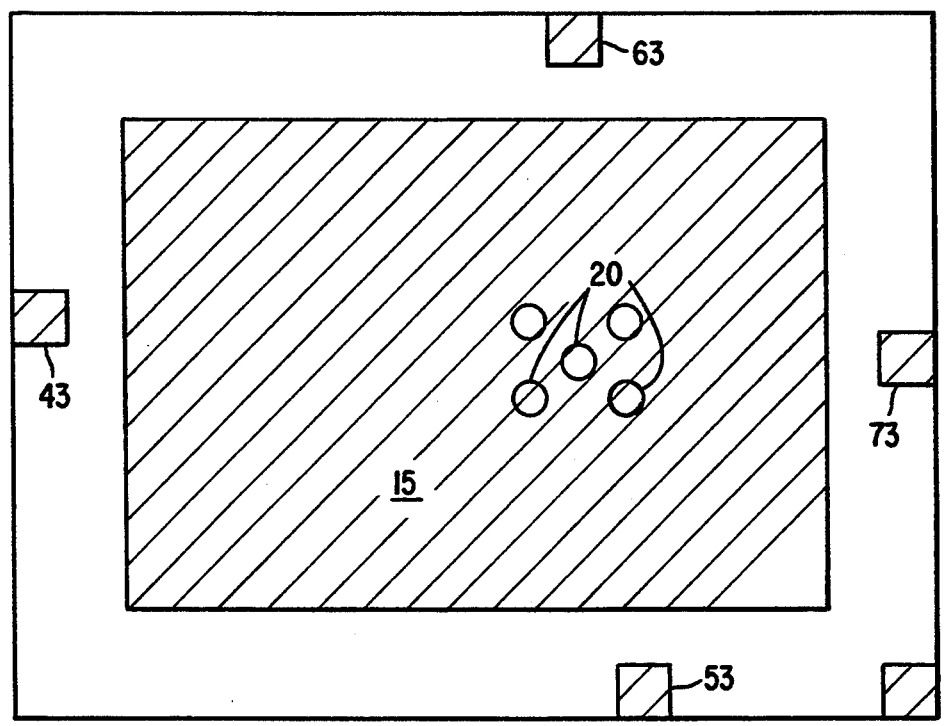

FIG. 5 shows the actual physical layout of the front side and the back side of the package designed according to the present invention. The slashed areas are the metal conductors. The white portion is the dielectric board. The metal portions can be fabricated with conventional thick-film or thin-film techniques. The metal can be gold, silver, copper, etc., each having merits and demerits. In this figure, thick-film was used. The front side metal is gold, and the back side metal is silver. The reason why the thick-film technique is used that the thick-film technique is cheaper than the thin-film technique. The front side gold can easily be wire-bonded and is not erosive, but can be attacked by lead solder. The silver is used in the back side, for it can avoid the attack of the soldering lead and the cost is lower than gold, but silver cannot be wire-bonded and can react with sulfur. Copper is a cheaper material and not easily attacked by lead, but is costly to fabricate and chemically reactive (or unstable). The material for the dielectric plate can use any material suitable for microwave applications, such as $Al_2O_3$, aluminum nitride, sapphire, quartz, etc., and other printed circuit board meterial such as Duroid, Teflon, etc. This example adopted $Al_2O_3$ as the base plate for its high dielectric constant (to reduce the circuit area), low loss, and rigidity. Aluminum nitride, sapphire and quartz also possess these advantages and therefore can also be used. Aluminum nitride has the added advantage of having higher thermal conductivity to dissipate heat.

In this practical example, there are four transition sections 43, 53, 63, 73, a central ground pad 44, and three filters 42, 52, 62 in this package. There are two input ports 1, 2 operating in the frequency range of 10.95 to 11.7 GHZ and 10 GHZ; a d.c. supply port 3; and an output port 4. The operating frequency is from 0.95 GHz to 1.7 GHz. The three auxiliary filter sections 42, 52, 62 perform band-stop, low-pass, and low-pass functions respectively. Port 9 in the figure is for d.c. supply and does not have filtering function. The band-stop range is from 8.3 GHz to 9.05 GHz.; the pass-band range is from 10.95 GHz to 11.7 GHz; and the low-pass range is from d.c. to 10 GHz. This package is used for a direct broadcast satellite communication receiver to mount a low noise block of monolithic microwave multi-chip integrated circuit (LNB MMIC). The grey rectangular background 15 is at the reference ground potential. The five holes 20 are the metallic via holes, which connect the ground potential at the back side to the front side so supply the ground potential for the IC. The higher the operating frequency, the denser should be the via holes. The equivalent circuit for these via holes is an inductance, and can be calculated from commercial softwares such as Touchstone, Libra, etc. There are four metal transition sections labeled as 43, 53, 63, 73 to transmit the signal between the bottom surface and the top surface.

Figure 6A:
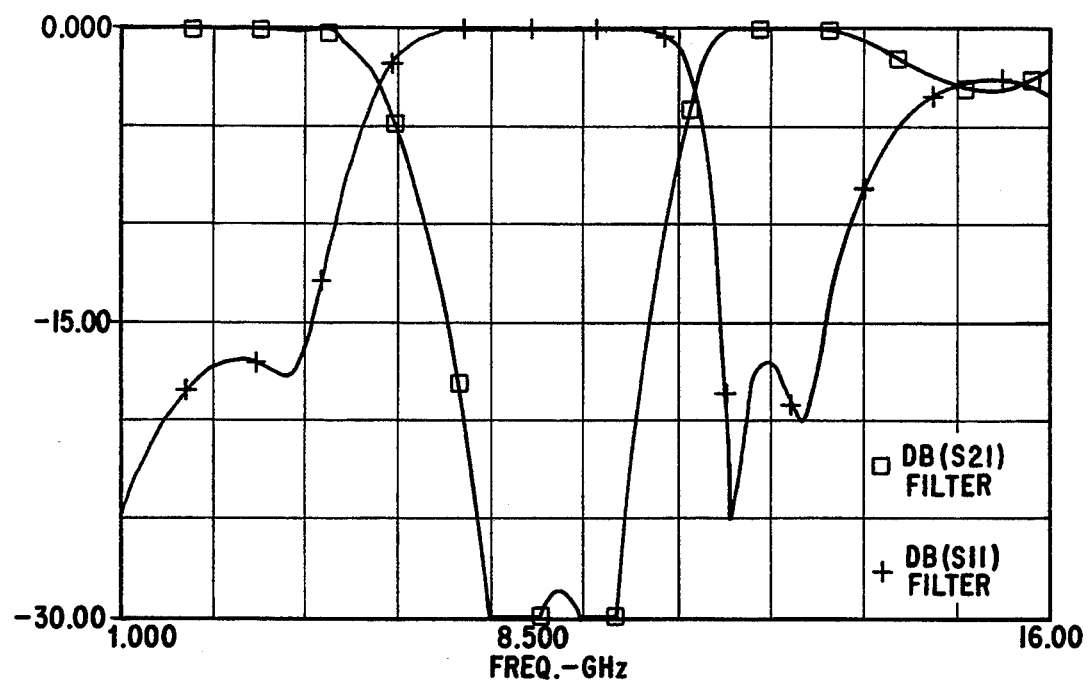
FIGS. 6(a) and 6(b) show the modeled and measured band-stop filtering characteristics of the package.
Figure 6B:
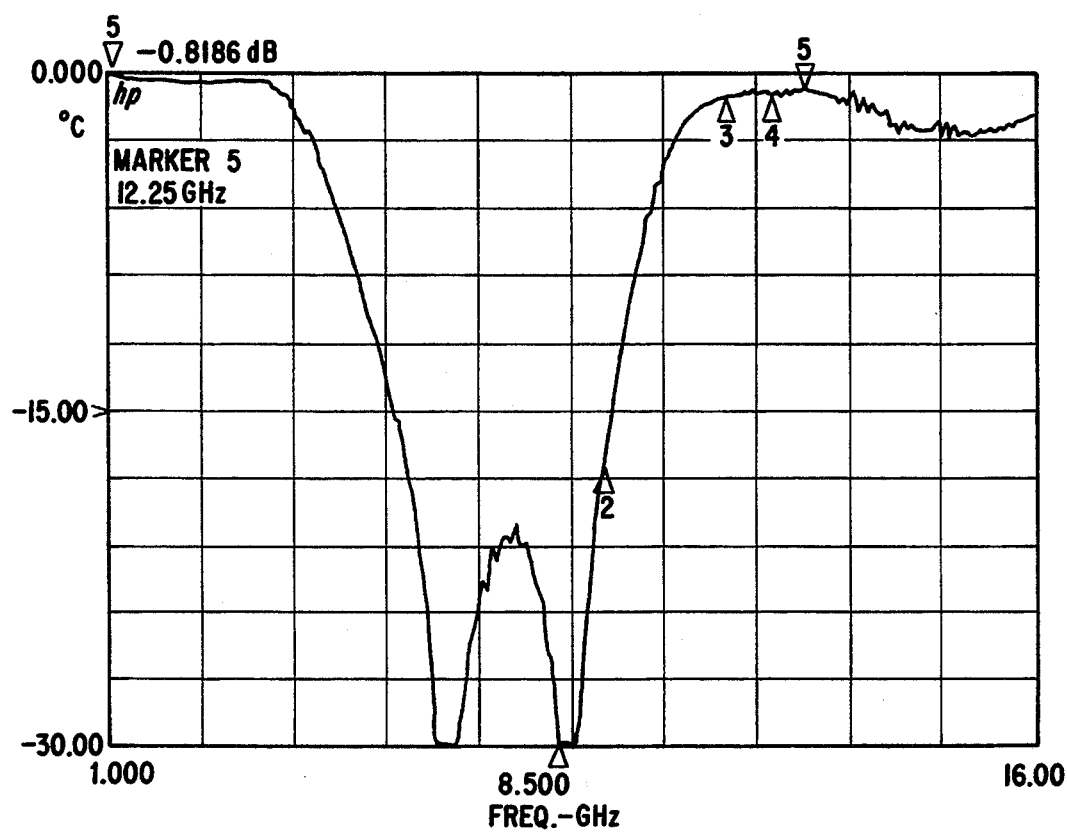
Figure 7A:
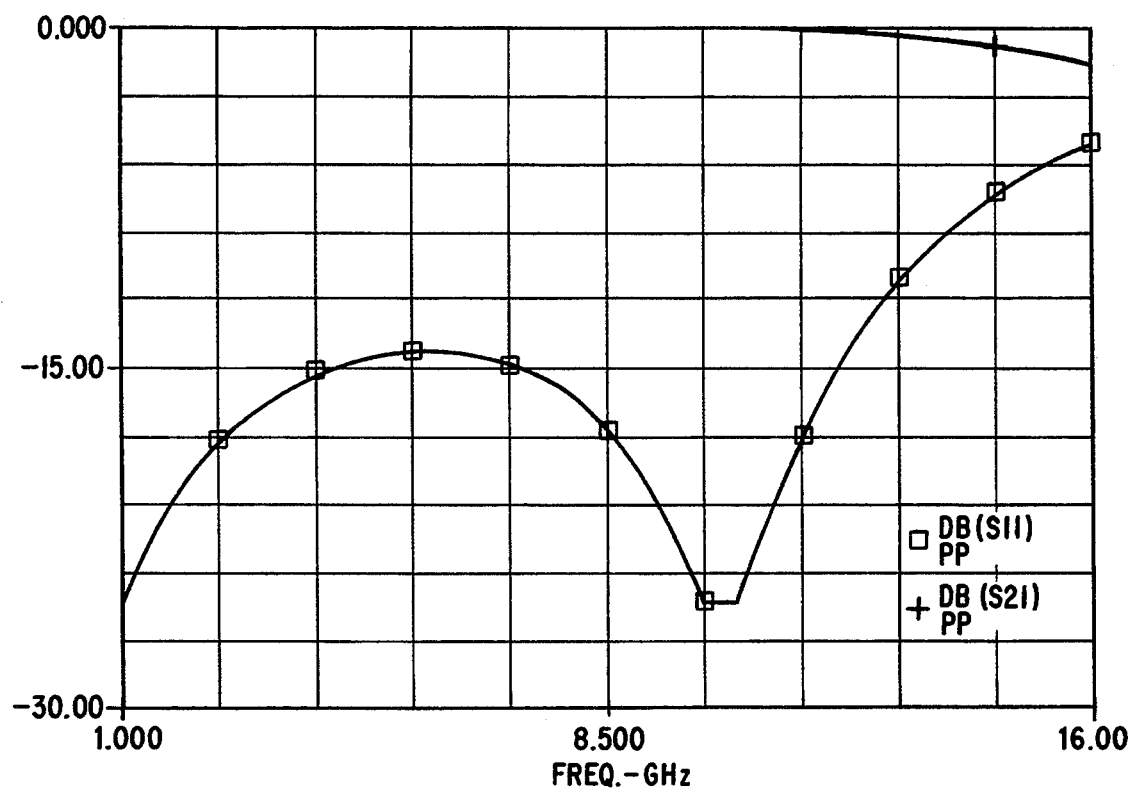
FIGS. 7(a)–7(c) show the modeled and measured low-pass filtering characteristics of the package.
Figure 7B:
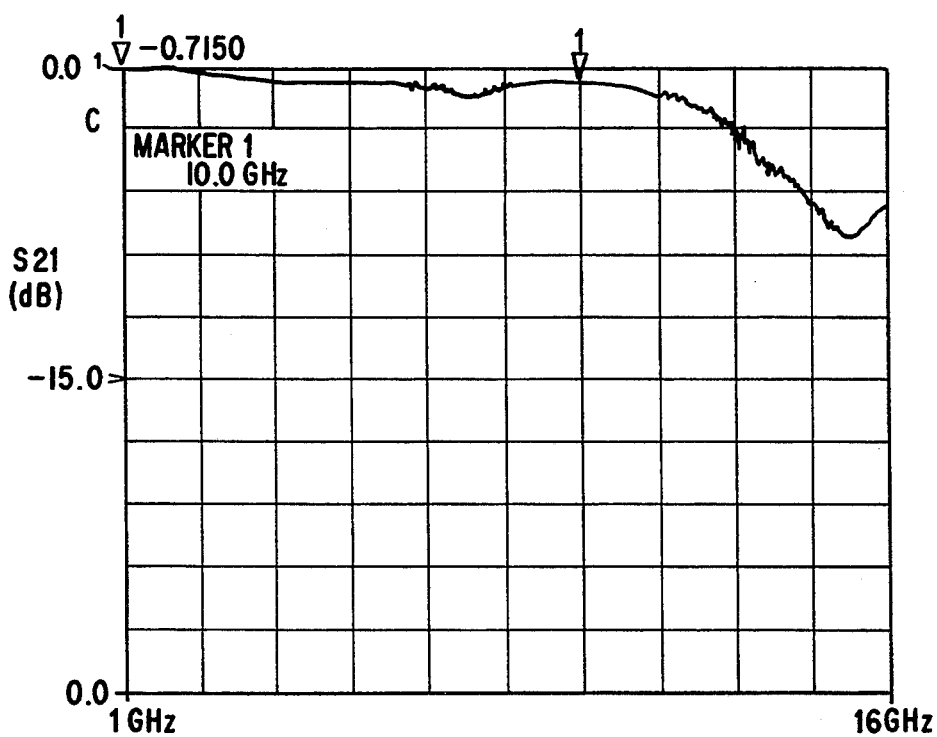
Figure 7C:
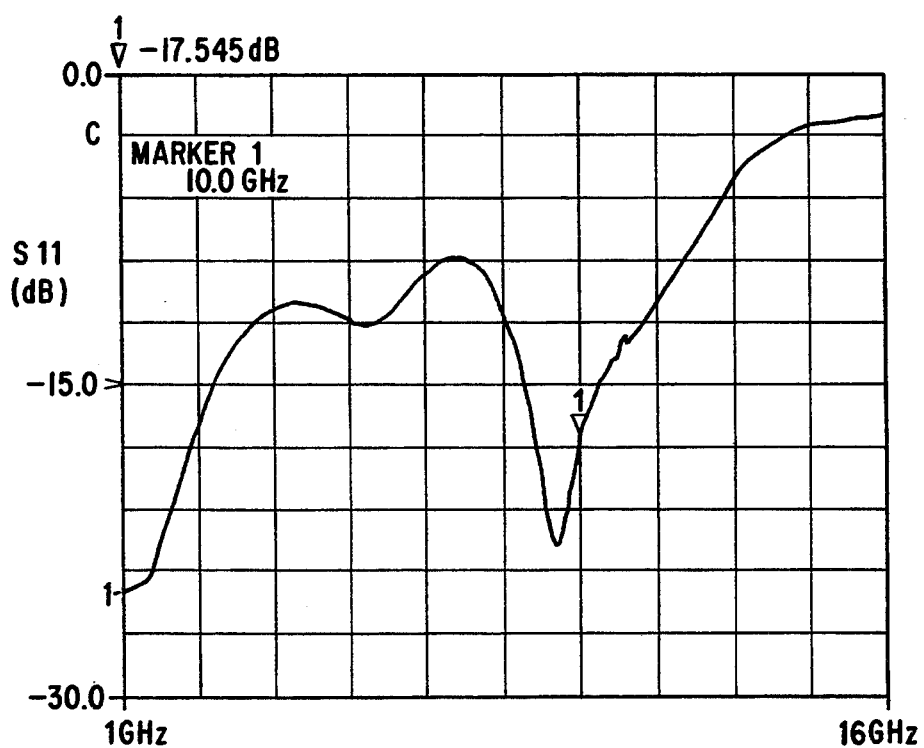

FIG. 6 shows the frequency response of a band-stop filter. Graph (a) shows the simulated result from the Touchstone software program. Graph (b) shows the experimental result as measured by the "HP8510" Network Analyzer. FIG. 7, graph (a) shows the frequency response of a low-pass filter as simulated by the Touchstone program, and graph (b) shows the measured result. In both cases, there is good agreement.

What is claimed is:

1. A surface-mountable and frequency selective package for a microwave intergrated circuit (IC), comprising:

a dielectric plate, having a front side and a back side, a grounded terminal at the back side of said plate which is grounded, a die mount at the front side of said plate, which is mounted with said integrated circuit, said dielectric plate having holes filled with metal connected between said ground terminal and said die mount for grounding said integrated circuit, at least one signal transition terminal through which a signal transmits, including a first pad of metal and a suspended transmission line of metal on the front side of said dielectric plate and a surface mounting pad of metal at the back side of said dielectric plate for surface mounting;

a filter section connected between said signal transition terminal and said die mount for filtering said signal;

the metal on the front side of said plate being of different material from the metal on the back side of said plate.

2. A surface-mountable and frequency selective package as described in claim 1, wherein said metal on the front side is gold and said metal on the back side is silver.

3. A surface-mountable and frequency selective package as described in claim 1, wherein said plate is selected from a group consisting of $Al_2O_3$, aluminum nitride, BeO, sapphire, quartz, Teflon and Duroid.

4. A surface-mountable and frequency selective package as described in claim 1, wherein said filter is a low-pass filter.

5. A surface-mountable and frequency selective package as described in claim 1, wherein said filter is a band-pass filter.

6. A surface-mountable and frequency selective package as described in claim 1, wherein said filter is a band-stop filter.

7. A surface-mountable and frequency selective package as described in claim 1, wherein said filter is a high-pass filter.

* * * * *